United States Patent
Wang et al.

(10) Patent No.: US 9,449,901 B1
(45) Date of Patent: Sep. 20, 2016

(54) LEAD FRAME WITH DEFLECTING TIE BAR FOR IC PACKAGE

(71) Applicant: FREESCALE SEMICONDUCTOR, INC., Austin, TX (US)

(72) Inventors: Zhijie Wang, Tianjin (CN); Zhigang Bai, Tianjin (CN); You Ge, Tianjin (CN); Meng Kong Lye, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/887,304

(22) Filed: Oct. 19, 2015

(30) Foreign Application Priority Data

Apr. 3, 2015 (CN) .......................... 2015 1 0297163

(51) Int. Cl.
| | |
|---|---|
| *H01L 23/495* | (2006.01) |
| *H01L 23/31* | (2006.01) |
| *H01L 23/00* | (2006.01) |
| *H01L 23/367* | (2006.01) |
| *H01L 21/56* | (2006.01) |

(52) U.S. Cl.
CPC ....... *H01L 23/49541* (2013.01); *H01L 21/565* (2013.01); *H01L 23/3107* (2013.01); *H01L 23/3675* (2013.01); *H01L 23/49503* (2013.01); *H01L 24/48* (2013.01); *H01L 24/85* (2013.01); *H01L 2224/48247* (2013.01)

(58) Field of Classification Search
CPC ..... H01L 23/495; H01L 21/56; H01L 23/28; H01L 23/49541; H01L 23/49548; H01L 23/49551; H01L 21/4828; H01L 21/4842; H01L 23/49582; H01L 24/16; H01L 24/48; H01L 24/49; H01L 24/85; H01L 24/97
See application file for complete search history.

(56) References Cited

U.S. PATENT DOCUMENTS

| | | | |
|---|---|---|---|
| 5,703,396 A | 12/1997 | Kurihara | |
| 5,889,318 A * | 3/1999 | Corisis ............. | H01L 23/49544 257/666 |
| 6,229,205 B1 | 5/2001 | Jeong et al. | |
| 6,246,110 B1 * | 6/2001 | Kinsman .......... | H01L 23/49551 257/666 |
| 6,265,771 B1 | 7/2001 | Ference et al. | |
| 7,009,283 B1 | 3/2006 | De Simone et al. | |
| 7,183,485 B2 * | 2/2007 | Groothuis ........... | H01L 23/4951 174/521 |
| 8,193,043 B2 | 6/2012 | Jeon et al. | |
| 2014/0239479 A1 | 8/2014 | Start | |

\* cited by examiner

*Primary Examiner* — Roy Potter
(74) *Attorney, Agent, or Firm* — Charles E. Bergere

(57) ABSTRACT

A packaged integrated circuit (IC) device having a heatsink mounted onto an IC die, itself mounted onto a die pad, is assembled using a lead frame having tie bars that deflect during an encapsulation phase of the device assembly, which enables the die pad, the die, and the heatsink to move relative to the lead frame support structure when compressive force is applied by the molding tool. This movement results in negligible relative displacement between the heatsink and the die during encapsulation, which reduces the probability of physical damage to the die. Each tie bar has a number of differently angled sections that enable it to deflect when compressive force is applied to it.

13 Claims, 4 Drawing Sheets

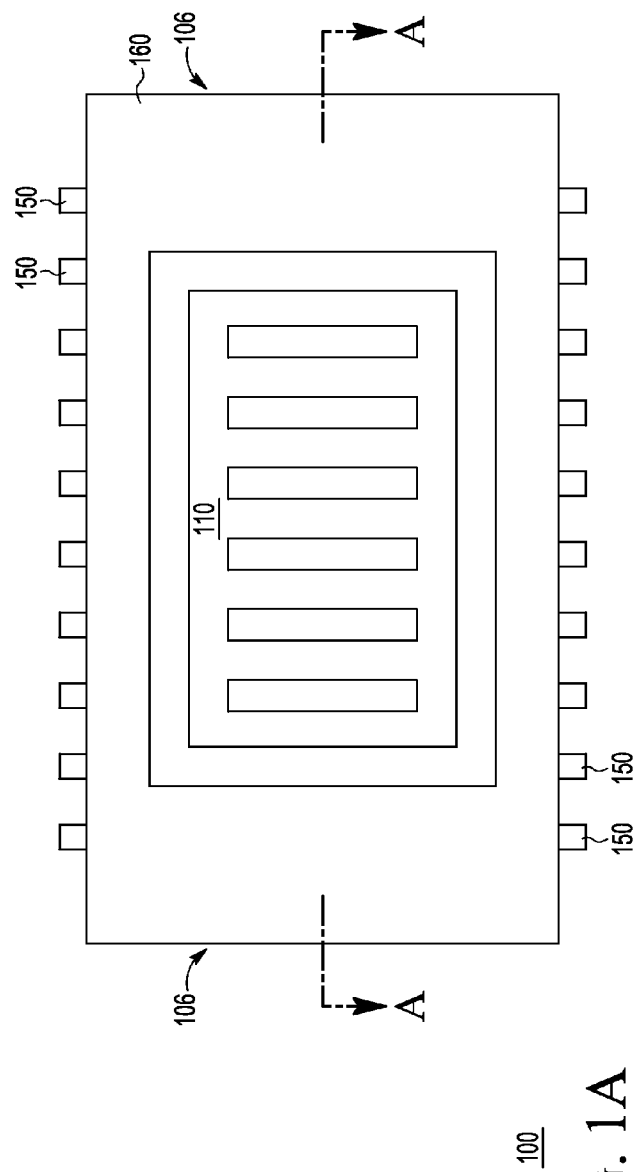
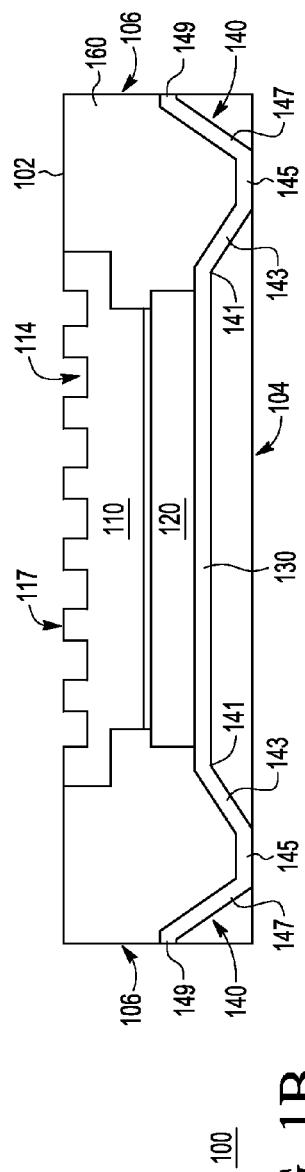
FIG. 1A
FIG. 1B

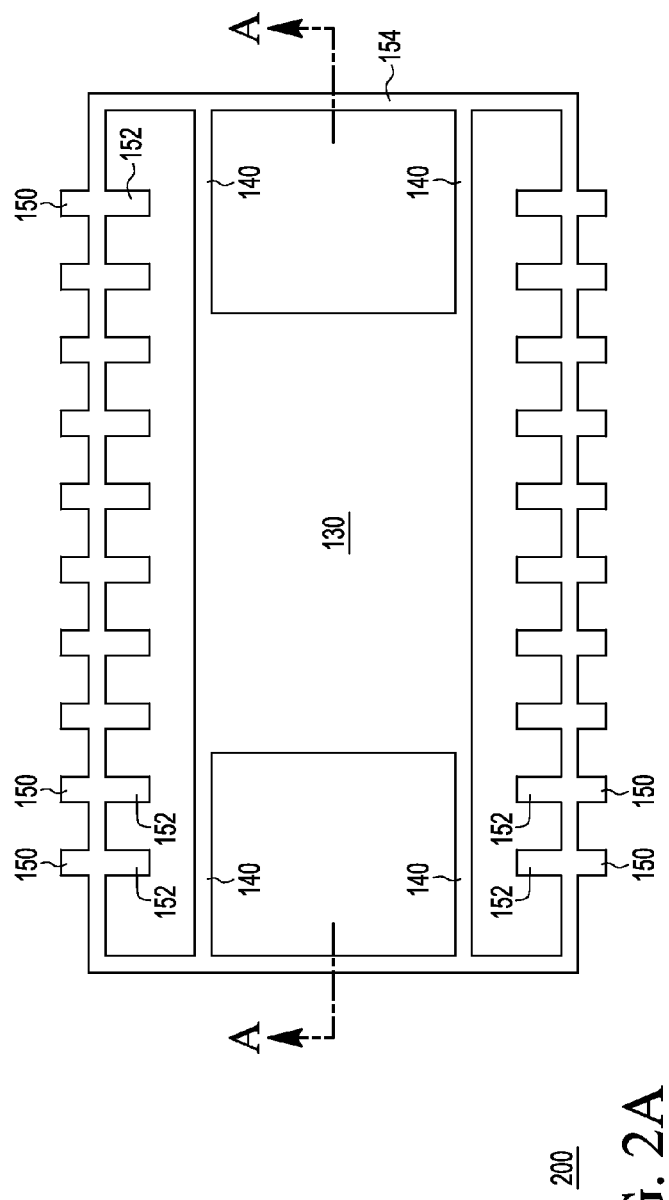
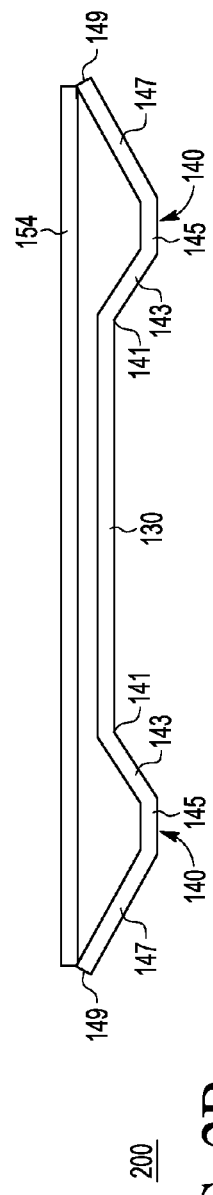
FIG. 2A
FIG. 2B

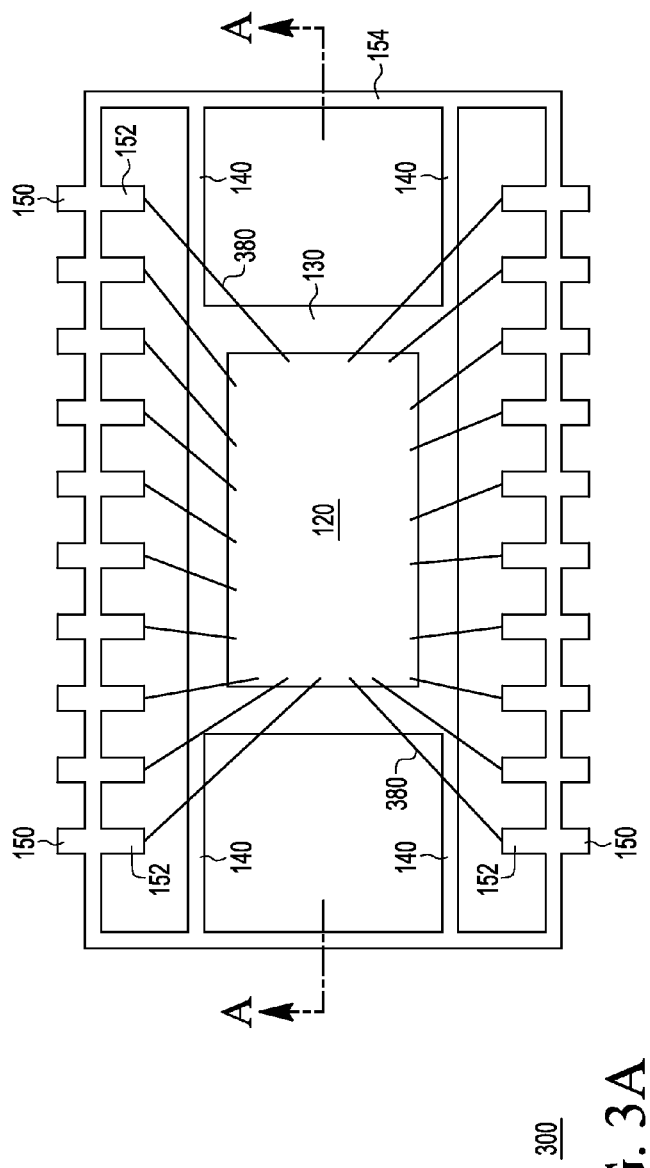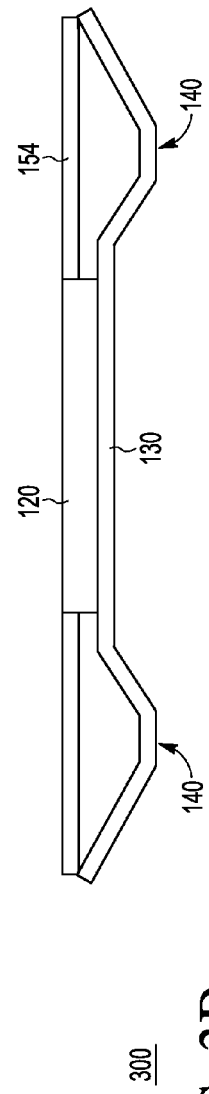
FIG. 3A
FIG. 3B

LEAD FRAME WITH DEFLECTING TIE BAR FOR IC PACKAGE

BACKGROUND

The present invention relates to packaged integrated circuit (IC) devices and more particularly to packaged IC devices assembled using lead frames.

In order to prevent internally generated heat from damaging an IC die in a packaged IC device, the device may include a heatsink that is mounted on top of the die, where the top side of the heatsink is exposed at an outer surface of the packaged device. During the molding or encapsulation phase of the device assembly process, the molding tool applies force to the device sub-assembly to prevent liquid molding compound from seeping between the top side of the heatsink and the bottom surface of the top mold chase of the molding tool and thereby covering some or all of the top side of the heatsink with molding compound, which would inhibit the packaged device's heat dissipation capabilities. Unfortunately, the compressive force applied by the molding tool during the encapsulation phase can result in physical damage, such as cracking, to the IC die.

BRIEF DESCRIPTION OF THE DRAWINGS

Embodiments of the invention will become fully apparent from the following detailed description, the appended claims, and the accompanying drawings in which like reference numerals identify similar or identical elements.

FIGS. 1A and 1B are, respectively, a top plan view and a cross-sectional side view of a packaged IC device according to one embodiment of the invention;

FIGS. 2A and 2B are, respectively, a top plan view and a cross-sectional side view of a lead frame used to assemble the packaged IC device of FIG. 1;

FIGS. 3A and 3B are, respectively, a top plan view and a cross-sectional side view of the device sub-assembly after the IC die of FIG. 1 has been mounted onto the die pad and electrically connected to the lead structures of the lead frame of FIG. 2.

DETAILED DESCRIPTION

Figure 4:
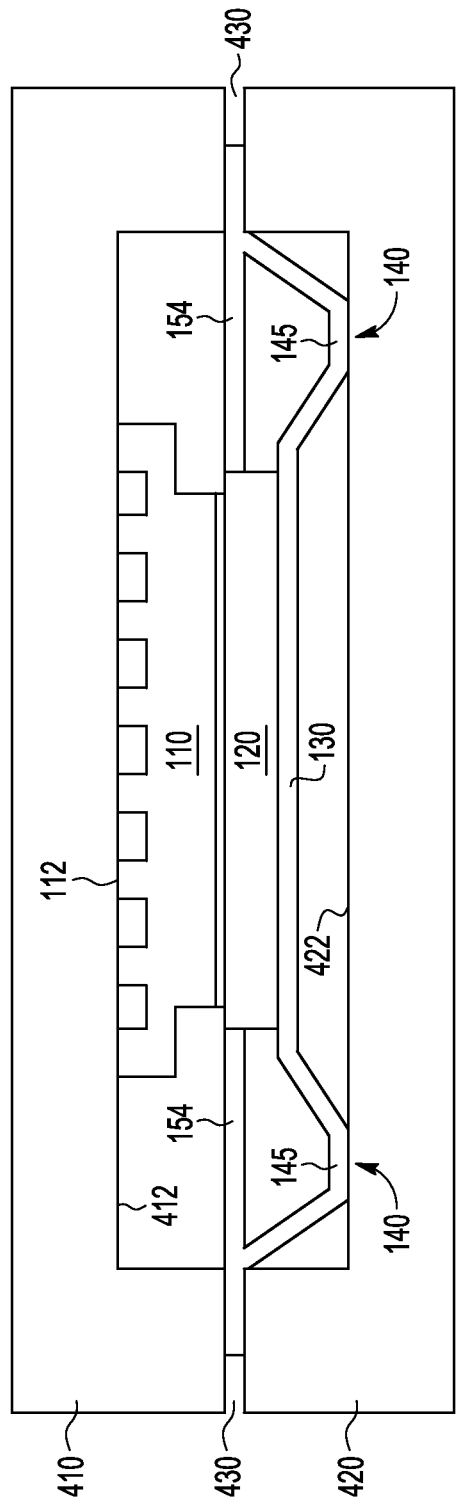
FIG. 4 is a cross-sectional side view of the sub-assembly of FIG. 3 after the heatsink of FIG. 1 has been mounted onto the IC die located between the top and bottom mold chases of a molding tool used during the encapsulation phase of the assembly of the packaged IC device of FIG. 1.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention is an article of manufacture that comprises a lead frame for a package device. The lead frame comprises a die pad and a plurality of tie bars connected to the die pad at proximal ends of the tie bars, wherein, during assembly of the packaged device, (i) distal ends of the tie bars are connected to lead frame support structure and (ii) the tie bars deflect to enable the die pad to move relative to the lead frame support structure.

In another embodiment, the present invention provides a method for assembling a packaged device. A die is mounted onto a die pad of a lead frame further comprising a plurality of tie bars connected to the die pad at proximal ends of the tie bars and to lead frame support structure at distal ends of the tie bars. The die is wire bonded to leads of the lead frame using bond wires. A heatsink is mounted onto the die to provide a sub-assembly. An encapsulation phase is performed on the sub-assembly, wherein the tie bars deflect and the die pad moves relative to the lead frame support structure during the encapsulation phase.

Referring now to FIGS. 1A and 1B, respectively, a top plan view and a cross-sectional side view (along the cut line AA of FIG. 1A) of a packaged IC device 100 according to one embodiment of the invention are shown. The packaged IC device 100 has as a top surface 102, an opposing bottom surface 104, and a peripheral surface 106. A heatsink 110 having a top surface 112, which may be patterned with features 114, is mounted on an IC die 120, which is itself mounted on a die pad 130. The device 100 also has a plurality of tie bars 140 connected at proximal ends 141 to the die pad 130. Each of the tie bars 140 has a proximal end 141, a proximal section 143, an intermediate section 145, a distal section 147 and a distal end 149. A plurality of outer leads 150, which are electrically connected to bond pads (not shown) on an active surface of the die 120 (such as with bond wires), extend out from the package body and allow the die 120 to be connected to other electronic components or circuitry. A molding compound 160 covers the die 120, the die pad 130, and the bond wires as well as portions of the heatsink 110, the tie bars 140, and the outer leads 150.

The top surface 112 of the heatsink 110 preferably is patterned with the features 114 in order to increase the total effective surface area of the top surface 112 and thereby increase the heat dissipation capabilities of the heatsink 110. Preferably the entire top surface 112 of the heatsink 110 is exposed at the top outer surface 102 of the packaged device 100. Note also that the intermediate section 145 of each tie bar 140 is exposed at the bottom outer surface 104 of the packaged device 100 and a distal end 149 of each tie bar 140 is exposed at the peripheral surface 106 of the packaged device 100. These exposed portions 145, 149 of the tie bar 140 provide additional heat dissipation paths for the packaged device 100.

As shown in FIG. 1B, the proximal section 143 of each tie bar connects the proximal end 141 (at which the tie bar 140 is connected to the die pad 130) to the intermediate section 145, and the distal section 147 connects the intermediate section 145 to the distal end 149.

As shown in FIG. 1B, the proximal section 143 of each tie bar connects the proximal end 141 (at which the tie bar 140 is connected to the die pad 130) to the intermediate section 145, and the distal section 147 connects the intermediate section 145 to the distal end 149.

FIGS. 2-4 represent different stages in the assembly of the packaged IC device 100 of FIG. 1.

FIGS. 2A and 2B are, respectively, a top plan view and a cross-sectional side view (along the cut line AA of FIG. 2A) of a metal (e.g., copper) lead frame 200 used to assemble the packaged IC device 100 of FIG. 1. The lead frame 200 may be formed either individually or in a strip as is known in the art. The lead frame 200 includes the die pad 130, four tie bars 140, and outer leads 150, all of which are shown in FIG. 1. In addition, the lead frame 200 includes inner leads 152 and a rectangular dam bar 154, which holds all of the other elements of the lead frame 200 together during device assembly. The inner and outer leads 152, 150 project inwardly and outwardly from the dam bar 270. The inner leads 152 are electrically connected to the die 120 with the bond wires and covered with the molding compound 160, while the outer leads 150 project outwardly from the molding compound 160. The dam bar 154 is removed during the assembly process, in this case preferably by punching.

The distal end 149 of each tie bar 140 connects the tie bar 140 to the dam bar 154. As shown in FIG. 2B, (i) the proximal section 143 of each tie bar 140 extends at a downward angle from the proximal end 141 to the intermediate section 145, (ii) the intermediate section 145 is parallel to the plane defined by the die pad 130, and (iii) the distal section 147 extends at an upward angle from the intermediate section 145 to the distal end 149. Because of the relative lengths and angles of these different sections, the elevation level of the die pad 130 is below the elevation level of the dam bar 154.

FIGS. 3A and 3B are, respectively, a top plan view and a cross-sectional side view (along the cut line AA of FIG. 3A) of a device sub-assembly 300 after the IC die 120 has been mounted and attached to the die pad 130 (using a suitable adhesive) and electrically connected with bond wires 380 to the inner leads 152. FIG. 3A shows the bond wires 380, while in FIG. 3B, the bond wires 380 are omitted for simplicity. Note that, during the die-placement and wire-bonding phases of the assembly process, the die pad 130 is directly supported from below by assembly-phase tooling (not shown).

FIG. 4 is a cross-sectional side view of the sub-assembly 300 of FIG. 3 after the heatsink 110 has been mounted on the IC die 120 using a suitable adhesive, such as a thermally conductive adhesive. The resulting sub-assembly is located in a molding tool between a top mold chase 410 and a bottom mold chase 420 so that an encapsulation phase of the assembly may be performed. A status gap 430 is provided to indicate that the top and bottom mold chases 410 and 420 are properly seated. As shown in FIG. 4, a bottom surface 412 of the top mold chase 410 abuts the top surface 112 of the heatsink 110. During the encapsulation phase, the liquid molding compound 160 (not shown in FIG. 4) is injected into the mold formed by the top and bottom mold chases 410 and 420 through injection gaps (not shown).

In order to prevent the molding compound 160 from covering the top surface 112 of the heatsink 110, sufficient compressive force must be applied to the sub-assembly by the top and bottom mold chases 410 and 420, and it is this compressive force that can result in physical damage to the IC die 120.

However, according to the present invention, due to the design of the tie bars 140, the tie bars 140 will deflect and allow the die pad 130 (along with the die 120 and the heatsink 110) to move (vertically down in the view of FIG. 4) with respect to the lead frame dam bar 154 in response to the application of compressive force by the top and bottom mold chases 410 and 420. Because the die pad 130 is able to move vertically, there is negligible relative displacement between the heatsink 110 and the die 120 when the molding tool applies compressive force during the encapsulation phase.

During the encapsulation phase, the intermediate sections 145 of the tie bars 140 are directly supported on the top surface 422 of the bottom mold chase 420, but the bottom mold chase 420 does not directly support the die pad 130, thereby enabling the die pad 130 to move vertically with respect to the tie bar intermediate sections 145 in response to the applied compressive force. In an ideal lead frame design, the proximal sections 143 of the tie bars 140 will deflect enough to prevent the applied compressive force from damaging the IC die 120, but still be stiff enough to ensure that no molding compound 160 will seep onto the top surface 112 of the heatsink 110. After the liquid molding compound 160 is injected into the mold, it is cured, e.g., by heating, to encapsulate the sub-assembly.

Those skilled in the art will understand that the packaged IC device 100 of FIG. 1 is typically assembled in parallel with multiple other instances of the device 100 using a strip of the lead frames 200 of FIG. 2, where the lead frame dam bar 154 functions as the support structure for adjacent lead frames 200 in the strip. In such case, after the encapsulation phase of FIG. 4, the resulting encapsulated sub-assemblies are separated by punching away the dam bar, thereby electrically isolating the outer leads 150 and the die pads 130 of the packaged IC devices 100. The outer leads 150 may then be trimmed and formed to complete the assembly of each instance of the package IC device 100 of FIG. 1.

Note that the exposed top portion of the heatsink 110 is wider than the bottom portion that mates with the die 120. This enables greater heat dissipation while still providing access to the top surface of the die 120 for the bond wires 380.

Although the invention has been described in the context of the lead frame 200 of FIG. 2 having four mutually parallel tie bars 140, other embodiments of the invention may have other numbers of tie bars and/or tie bars that are not all mutually parallel. For example, the tie bars could be four diagonal tie bars that connect the four corners of a rectangular die pad to the four corners of a rectangular support structure.

Although the invention has been described in the context of the lead frame 200 of FIG. 2 in which the die pad 130 elevation level is below the dam bar 154 elevation level, in other embodiments of the invention, the die pad elevation level is the same as or above the support structure elevation level.

Although the invention has been described in the context of the lead frame 200 of FIG. 2 in which each tie bar 140 has the proximal, intermediate, and distal sections 143, 145, and 147, those skilled in the art will understand that there are other geometry designs for tie bars that will deflect sufficiently during the encapsulation phase of device assembly to prevent or at least inhibit physical damage to the IC die.

Although the invention has been described in the context of the lead frame 200 which has resilient tie bars 140 that may act like springs, in general, it is sufficient for tie bars of the invention to deflect in one direction during the encapsulation phase. It is not necessary for the tie bars to be able to resume their original shape after the compressive force of the encapsulation phase is removed.

Although the invention has been described in the context of the packaged IC device 100 of FIG. 1 having the single IC die 120, other embodiments of the invention may have multiple IC dies mounted either side-by-side and/or one top of one another and/or additional elements such as, without limitation, additional heatsinks and/or interposers.

A lead frame is a collection of metal leads and possibly other elements (e.g., power bars, die pads also known as die paddles and die flags) that is used in semiconductor packaging for assembling one or more integrated circuit (IC) dies into a single packaged IC device. Prior to assembly into a packaged device, a lead frame may have support structures (e.g., a dam bar and tie bars) that keep those elements in place. During the assembly process, the support structures may be removed. As used herein, the term "lead frame" may be used to refer to the collection of elements before assembly or after assembly, regardless of the presence or absence of those support structures.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an article of manufacture may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. An article of manufacture comprising a lead frame for a packaged device, the lead frame comprising:
   a rectangular die pad; and
   a plurality of tie bars connected to the die pad at proximal ends of the tie bars, wherein, during assembly of the packaged device, (i) distal ends of the tie bars are connected to a dam bar of the lead frame and (ii) the tie bars are configured to deflect to enable the die pad to move relative to the dam bar,
   wherein:
       the lead frame comprises four tie bars extending from four corners of the die pad,
       each tie bar is perpendicular from an end of the die pad to the dam bar,
       the die pad defines a die-pad plane, and
       each tie bar has one or more sections that are not parallel to the die-pad plane and that enable the tie bars to deflect when the die pad moves relative to the lead frame support structure during the assembly.

2. The article of claim 1, wherein each tie bar comprises:
   a proximal section that extends from the proximal end of the tie bar at a downward angle;
   an intermediate section connected to the proximal section, wherein the intermediate section is substantially parallel to and lower than the die-pad plane; and
   a distal section that extends from the intermediate section at an upward angle to the distal end of the tie bar.

3. The article of claim 2, wherein the distal end of each tie bar lies above the die-pad plane such that, during the assembly, the die pad is lower than the dam bar.

4. The article of claim 1, further comprising:
   a die mounted on the die pad;
   bond wires electrically connecting the die to leads of the lead frame;
   a heatsink mounted on the die; and
   molding compound encapsulating the die, the bond wires, and the die pad.

5. The article of claim 4, wherein the tie bars deflect and the die pad, the die, and the heatsink move relative to the dam bar during an encapsulation phase of the assembly process, such that there is negligible relative displacement between the heatsink and the die during the encapsulation phase.

6. The article of claim 4, wherein the heatsink is exposed at an outer surface of the packaged device.

7. The article of claim 4, wherein a section of each tie bar is exposed at a different outer surface of the packaged device.

8. A method for assembling a packaged device, the method comprising:
   mounting a die by a bottom surface thereof on a die pad of a lead frame, wherein the die pad is rectangular and the lead frame has a plurality of tie bars connected to the die pad at proximal ends of the tie bars and to a dam bar at distal ends of the tie bars, and wherein there are four tie bars extending from four corners of the die pad;
   electrically connecting the die to leads of the lead frame with bond wires;
   mounting a heatsink onto a top surface of the die to provide a sub-assembly; and
   encapsulating the sub-assembly with a molding compound, wherein the tie bars deflect and the die pad moves relative to the dam bar during the encapsulating step, wherein:
   the die pad defines a die-pad plane; and
   each tie bar has one or more sections that are not parallel to the die-pad plane and that enable the tie bars to deflect when the die pad moves relative to the dam bar during the assembly.

9. The method of claim 8, wherein each tie bar comprises:
   a proximal section that extends from the proximal end of the tie bar at a downward angle;
   an intermediate section connected to the proximal section, wherein the intermediate section is substantially parallel to and lower than the die-pad plane; and
   a distal section that extends from the intermediate section at an upward angle to the distal end of the tie bar.

10. The method of claim 8, wherein the tie bars deflect and the die pad, the die, and the heatsink move relative to the dam bar during the encapsulating step such that there is negligible relative displacement between the heatsink and the die during the encapsulating step.

11. The method of claim 10, wherein the die pad is not directly supported from below during the encapsulating step.

12. The method of claim 8, wherein, during the encapsulating step, a molding tool applies compressive force to the sub-assembly to inhibit the molding compound from covering an outer surface of the heatsink, wherein the compressive force causes the tie bars to deflect and the die pad to move relative to the dam bar.

13. The packaged device assembled using the method of claim 12.

\* \* \* \* \*